(12) United States Patent
Nakata et al.

(10) Patent No.: US 6,963,115 B2
(45) Date of Patent: Nov. 8, 2005

(54) SEMICONDUCTOR DEVICE COMPRISING A DISCONTINUOUS REGION AND/OR A CONTINUOUS REGION HAVING TRENCH ISOLATION STRESS APPLIED THERETO

(75) Inventors: Kazuhisa Nakata, Osaka (JP); Katsuhiro Ootani, Nara (JP); Yasuyuki Sahara, Kyoto (JP); Shinsaku Sekido, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/656,199

(22) Filed: Sep. 8, 2003

(65) Prior Publication Data
US 2004/0099924 A1 May 27, 2004

(30) Foreign Application Priority Data
Nov. 21, 2002 (JP) .............................. 2002-338130

(51) Int. Cl.[7] ........................ H01L 29/76; H01L 29/94; H01L 31/062; H01L 31/113; H01L 31/119

(52) U.S. Cl. ........................................ 257/391; 257/392
(58) Field of Search ................................ 257/391, 392, 257/368, 270

(56) References Cited

U.S. PATENT DOCUMENTS

| 6,448,618 B1 * | 9/2002 | Inaba et al. .................. 257/391 |
| 2004/0140485 A1 * | 7/2004 | Matsuzaki et al. .......... 257/208 |

\* cited by examiner

Primary Examiner—Phat X. Cao
(74) Attorney, Agent, or Firm—McDermott Will & Emery LLP

(57) ABSTRACT

Gates of pMISFETs which need high current driving capability are high-driving-capability gates placed in discontinuous active regions or high-driving-capability gates disposed in two-input active regions. Gate of pMISFETs which do not need high current driving capability are normal gates arranged in continuous active regions. Since the high-driving-capability gates are provided in the discontinuous active regions or the two-input active regions, pMISFETs with high driving capability is achieved by utilizing light holes created due to a lattice distortion.

14 Claims, 8 Drawing Sheets

FIG. 9
Lg=0.15 μm  Wg=0.4 μm
|  |  | pattern | | | |
| --- | --- | --- | --- | --- | --- |
|  |  | (a) | (b) | (c) | (d) |
| PMISFET | Idsat ratio | 1.00 | 0.95 | 0.94 | 0.94 |
| NMISFET | Idsat ratio | 1.00 | 1.11 | 1.10 | 1.03 |
□ active region
▨ gate
▧ dummy gate
FIG. 10A
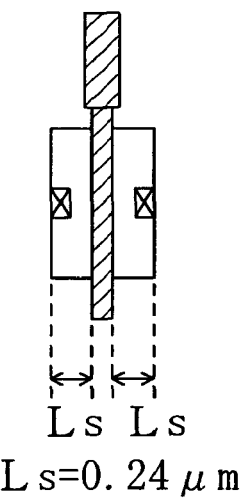
Ls  Ls
Ls=0.24 μm
FIG. 10B
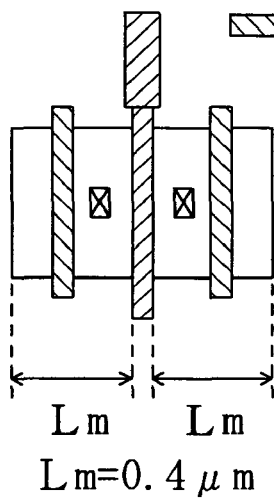
Lm  Lm
Lm=0.4 μm
FIG. 10C
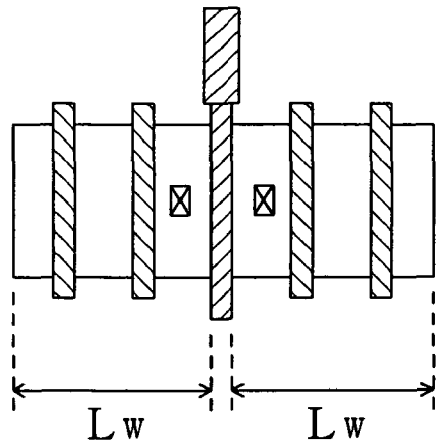
Lw  Lw
Lw=1 μm
FIG. 10D
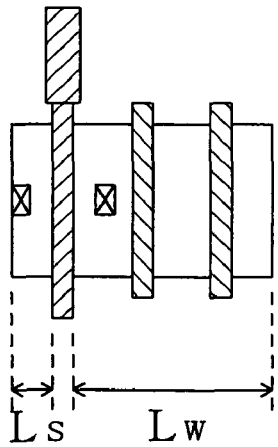
Ls  Lw
Ls=0.24 μm
Lw=1 μm

SEMICONDUCTOR DEVICE COMPRISING A DISCONTINUOUS REGION AND/OR A CONTINUOUS REGION HAVING TRENCH ISOLATION STRESS APPLIED THERETO

BACKGROUND OF THE INVENTION

FIG. 11 is a plan view showing a layout of a known semiconductor device in which a large number of MIS transistors (hereinafter, referred to as MISFETs) are arranged. As shown in FIG. 11, various types of active regions in which mutually different numbers of MISFETs are arranged at mutually different densities are provided in the semiconductor device, being surrounded by a trench isolation Ris. Hereinafter, an active region in which gates 101 of three or more respective MISFETs are continuously arranged without being separated by the trench isolation Ris will be referred to as a continuous active region R101, an active region in which only a gate 104 of a MISFET is placed will be referred to as a discontinuous active region R102, and an active region in which gates 106 of two respective MISFETs are disposed will be referred to as two-input active region R103. Dummy gates 107 are arranged on the trench isolation Ris of the semiconductor device so as to increase the accuracy in patterning for gates using a line-and-space pattern.

In addition, as shown in FIG. 11, a distance L101 between one of the gates 101 of the MISFETs located at each end thereof in the continuous active region R101 and the trench isolation Ris, a distance L102 between the gate electrode 104 of the MISFET in the discontinuous active region R102 and the trench isolation Ris, and a distance L103 between each of the gates 106 of the MISFETs in the two-input active region R103 and the trench isolation Ris, differ from one another.

In this manner, the known semiconductor device is configured to have a layout in which transistors in continuous active regions, transistors in discontinuous active regions and transistors in two-input active regions are mixed, in order to minimize the area occupied by the device.

It is considered that the reason why the known semiconductor device has been designed in the manner as described above is based on the premise that the performance of a semiconductor device is determined by the gate length and gate width of MISFETs. However, experiments done by the present inventors have revealed that the performance of a semiconductor device provided with recent MISFETs that have been minimized is changeable depending not only on the gate length and gate width of the MISFETs but also on the layout of the active regions. More specifically, even for MISFETs having the same circuit configuration, operating speeds of the respective MISFETs vary depending on the layouts thereof. That is to say, the performance of the whole semiconductor device is also affected by the layouts.

SUMMARY OF THE INVENTION

In the present invention, attention is drawn to a characteristic of MISFETs that the operating speeds thereof vary depending on distortion occurring in the active regions. It is therefore an object of the present invention to provide a high performance semiconductor device by achieving a layout utilizing this characteristic of the MISFETs.

Specifically, a first inventive semiconductor device includes: a first discontinuous active region in which only a gate of a pMISFET is placed; a first continuous active region in which gates of three or more respective pMISFETs are arranged; and a trench isolation surrounding the first discontinuous active region and the first continuous active region, wherein gates of pMISFETs of a first type are arranged in the first continuous active region, whereas a gate of a pMISFET of a second type, which needs higher current driving capability than the pMISFETs of the first type, is placed in the first discontinuous active region.

In this device, the pMISFET of the second type which needs high current driving capability is placed in the first discontinuous active region to which a large compressive stress is applied from the trench isolation. Accordingly, it is possible to improve the current driving capability of the pMISFET by utilizing light holes created in the valence band, thus obtaining a high performance semiconductor device.

The first inventive semiconductor device may further include a two-input active region which is surrounded by the trench isolation and in which gates of two respective pMISFETs are disposed, wherein gates of two respective pMISFETs of the second type are disposed in the two-input active region. Then, it is possible to suppress degradation in the performance of the pMISFETs, while reducing the area occupied by the active region of the whole semiconductor device.

In such a case, a dummy gate for separation is preferably provided between the gates of the two pMISFETs of the second type. Then, it is possible to prevent interference between signals for two pMISFETs.

The first discontinuous active region is preferably designed to have a width in the range greater than or equal to five times the gate length and less than or equal to 8.5 times the gate length, in the gate length direction.

The first discontinuous active region is preferably designed to have a width in the range greater than or equal to 0.6 $\mu$m and less than or equal to 1.0 $\mu$m in the gate length direction.

The first inventive semiconductor device may further include: a second discontinuous active region which is surrounded by the trench isolation and in which only a gate of an nMISFET is placed; and a second continuous active region which is surrounded by the trench isolation and in which gates of three or more respective nMISFETs are arranged, wherein gates of nMISFETs of the first type are arranged in the second continuous active region, whereas a gate of an nMISFET of the second type, which needs higher current driving capability than the nMISFETs of the first type, is placed in the second discontinuous active region. Then, it is possible to suppress degradation in current driving capability of the nMISFET caused by a stress from the trench isolation.

A second inventive semiconductor device includes: a discontinuous active region in which only a gate of an nMISFET is placed; a continuous active region in which gates of three or more respective nMISFETs are arranged; and a trench isolation surrounding the discontinuous active region and the continuous active region, wherein gates of nMISFETs of a first type are arranged in the continuous active region, whereas a gate of an nMISFET of a second type, which needs higher current driving capability than the nMISFETs of the first type, is placed in the discontinuous active region.

In this device, the nMISFETs of the second type which need high current driving capability are arranged in the continuous active region to which a small compressive stress is applied from the trench isolation. Accordingly, it is possible to suppress degradation in current driving capability of the nMISFETs caused by the stress, thus obtaining a high performance semiconductor device.

The second inventive semiconductor device may further include a two-input active region which is surrounded by the trench isolation and in which gates of two respective nMIS-FETs are disposed, wherein gates of nMISFETs of the first type are disposed in the two-input active region.

The semiconductor device may further include a dummy gate provided between the trench isolation and one of the gates of the nMISFETs of the second type located at an end thereof in the continuous active region. Then, it is possible to suppress degradation in current driving capability of all the nMISFET arranged in the continuous active region.

A distance between the trench isolation and one of the gates of the nMISFETs of the second type located at an end thereof in the continuous active region is preferably greater than or equal to four times the gate length.

A gate of an nMISFET of a third type in which a drain parasitic capacitance, a channel leakage current or a gate leakage current needs to be reduced more than in the nMISFETs of the first type is preferably placed in the discontinuous active region or the two-input active region.

BRIEF DESCRIPTION OF THE DRAWINGS

FIG. 9 is a table showing data on saturation current values Idsat of pMISFETs and nMISFETs having different gate patterns.

FIGS. 10A through 10D are plan views respectively showing a gate pattern in which finger lengths at both sides of a gate are a small finger length, a gate pattern in which finger lengths at both sides of a gate are a middle finger length, a gate pattern in which finger lengths at both sides of a gate are a large finger length, and a gate pattern in which a finger length at one side of a gate is the short finger length and a finger length at the other side of the gate is the large finger length.

DESCRIPTION OF THE PREFERRED EMBODIMENTS (Types of Active Regions and Misfits)

First, types of gates of respective MISFETs used in embodiments of the present invention will be described. The types of the gates are determined by the types of active regions in which the MISFETs are arranged. In the embodiments, these active regions are of three types, namely, discontinuous active regions R10, two-input active regions R20, or continuous active regions R30.

Figure 6A:
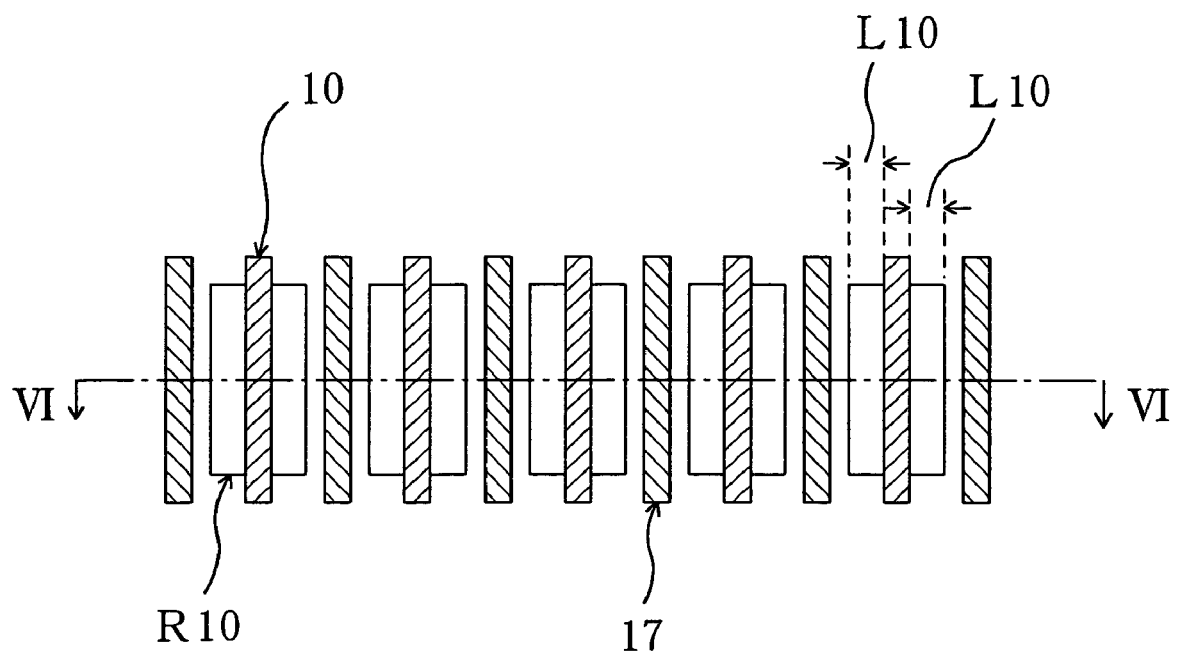
FIGS. 6A and 6B are respectively a plan view showing a layout of MISFETs in discontinuous active regions and a cross-sectional view taken along the line VI—VI in FIG. 6A.
Figure 6B:
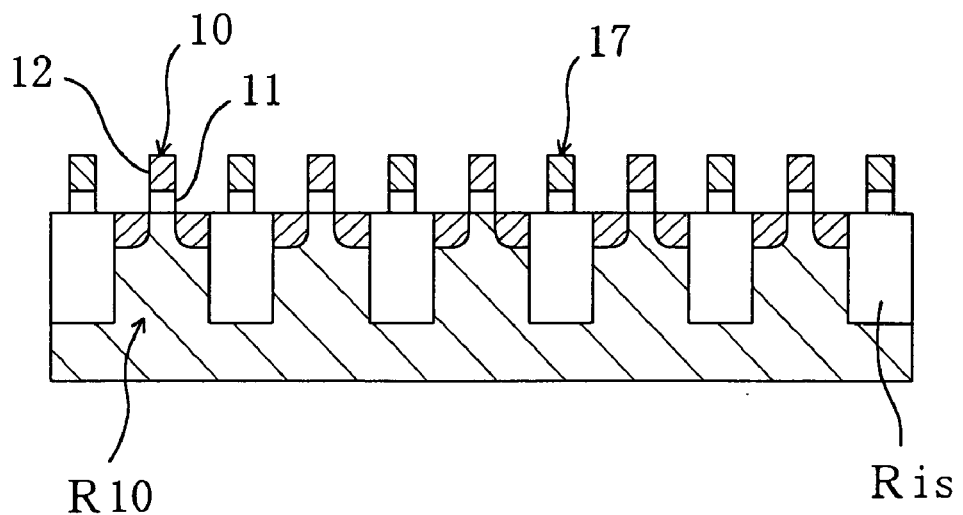

FIGS. 6A and 6B are respectively a plan view showing a layout of MISFETs in the discontinuous active regions R10 and a cross-sectional view taken along the line VI—VI in FIG. 6A.

As shown in FIGS. 6A and 6B, in each of the discontinuous active regions R10 surrounded by a trench isolation Ris (i.e., a region for isolating transistors), only one gate 10 including a gate insulating film 11 and a gate electrode 12 is placed. The gate 10 of a MISFET placed in each of the discontinuous active regions R10 is a gate facing the trench isolation Ris with no gate interposed therebetween at both sides thereof (hereinafter, referred to as an isolated gate). The distance between an outer side of the gate 10 of the MISFET placed in each of the discontinuous active regions R10 and the edge of the trench isolation Ris which is closest to the side of the gate 10 is defined as a finger length L10.

On the trench isolation Ris, dummy gates 17 are arranged so as to increase the accuracy in patterning for gates using a line-and-space pattern.

Figure 7A:
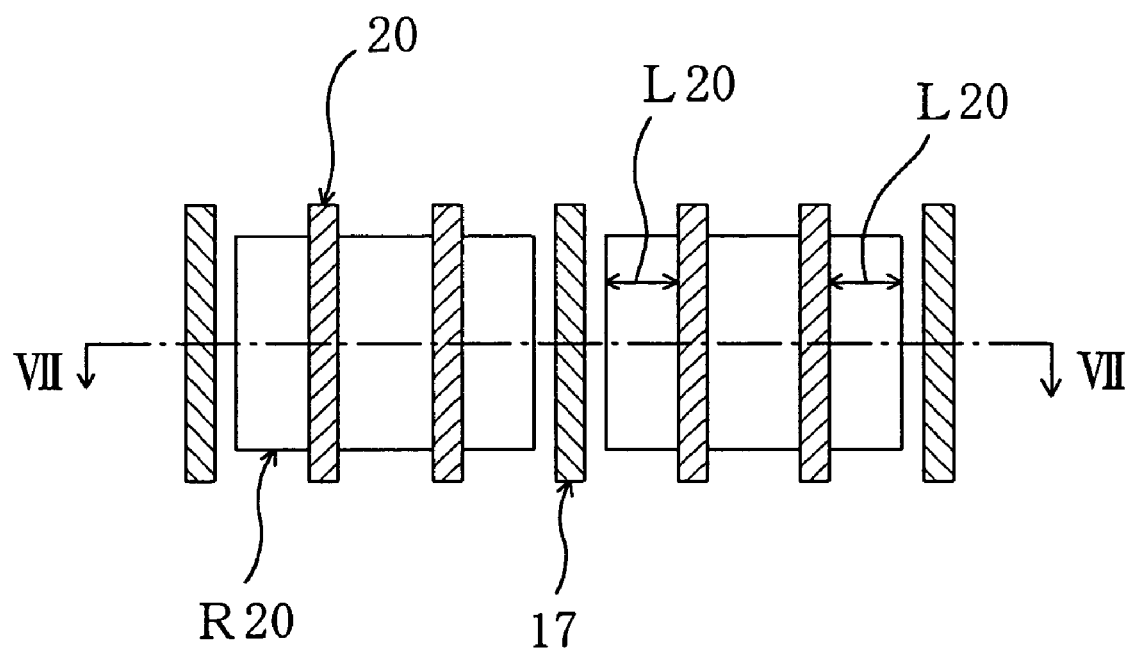
FIGS. 7A and 7B are respectively a plan view showing a layout of MISFETs in two-input active regions and a cross-sectional view taken along the line VII—VII in FIG. 7A.
Figure 7B:
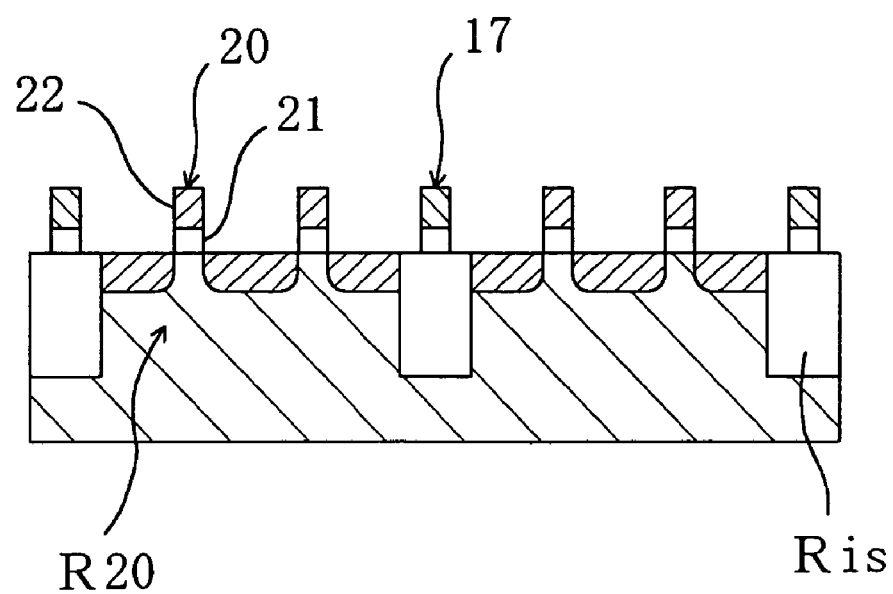

FIGS. 7A and 7B are respectively a plan view showing a layout of MISFETs in the two-input active regions R20 and a cross-sectional view taken along the line VII—VII in FIG. 7A.

As shown in FIGS. 7A and 7B, in each of the two-input active regions R20 surrounded by the trench isolation Ris (i.e., region for isolating transistors), two gates 20 each including a gate insulating film 21 and a gate electrode 22 are disposed. Each of the gates 20 of two respective MISFETs disposed in the two-input active regions R20 is a gate facing the trench isolation Ris with no gate interposed therebetween only at one side thereof (hereinafter, referred to as an end gate). The distance between an outer side of each of the gates 20 disposed in the two-input active regions R20 and the edge of the trench isolation Ris which is closest to the side is defined as a finger length L20.

Figure 8A:
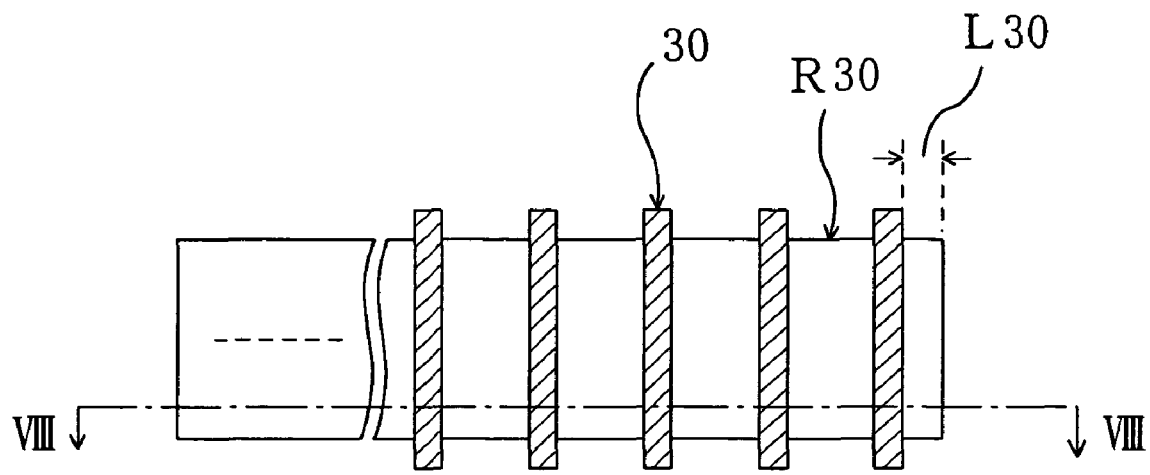
FIGS. 8A and 8B are respectively a plan view showing a layout of MISFETs in a continuous active region and a cross-sectional view taken along the line VIII—VIII in FIG. 8A.
Figure 8B:
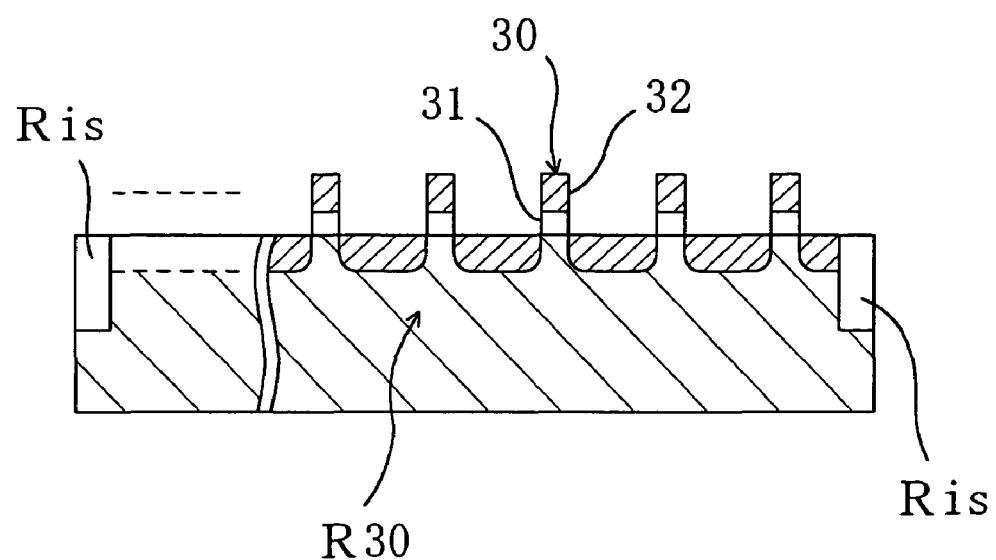
Figure 11:
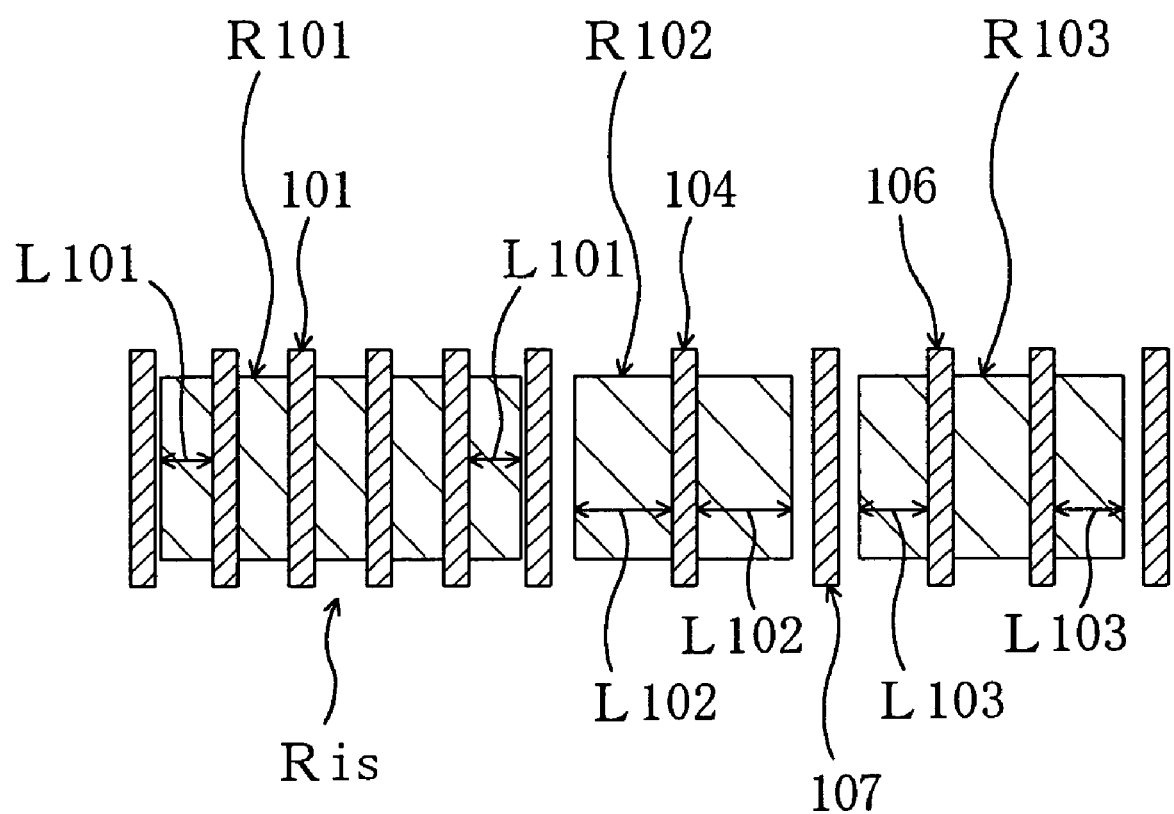
FIG. 11 is a plan view showing a layout of a known semiconductor device in which a large number of MISFETs are arranged.

FIGS. 8A and 8B are respectively a plan view showing a layout of MISFETs in one of the continuous active regions R30 and a cross-sectional view taken along the line VIII—VIII in FIG. 8A.

As shown in FIGS. 8A and 8B, in each of the continuous active regions R30 surrounded by the trench isolation Ris (i.e., region for isolating transistors), three or more gates 30 each including a gate insulating film 31 and a gate electrode 32 are arranged. The gates 30 of the three or more respective MISFETs arranged in each of the continuous active regions R30 are end gates facing the trench isolation Ris with no gates interposed therebetween only at one side thereof or gates facing other gates with no trench isolation Ris interposed therebetween at both sides thereof (hereinafter, referred to as intermediate gates).

The distance between an outer side of one of the gates 30 located at an end thereof in each of the continuous active regions R30 and the edge of the trench isolation Ris which is closest to the side is defined as a finger length L30.

FIG. 9 is a table showing data on saturation current values Idsat of p-channel type MISFETs (hereinafter, referred to as pMISFETs) and n-channel type MISFETs (hereinafter, referred to as nMISFETs) having gate patterns shown in FIGS. 10A through 10D. The saturation current values Idsat shown in FIG. 9 are represented as ratios when the saturation current values Idsat of the pMISFET and nMISFET each having a gate pattern shown in FIG. 10A are taken as "1". FIG. 10A shows a gate pattern in which finger lengths at both sides of a gate are a small finger length Ls (=0.24 μm). FIG. 10B shows a gate pattern in which finger lengths at both sides of a gate are a middle finger length Lm (=0.4 μm). FIG. 10C shows a gate pattern in which finger lengths at both sides of a gate are a large finger length Lw (=1.0 μm). FIG. 10D shows a gate pattern in which a finger length at one side of a gate is the small finger length Ls (=0.24 μm) and a finger length at the other side of the gate is the large finger length Lw (=1.0 μm). In any of the cases shown in FIGS. 10A through 10D, dummy gates are arranged at equal intervals.

FIG. 9 and FIGS. 10A through 10D indicate the following facts. The saturation current value Idsat of a pMISFET when finger lengths at both sides of the gate are the small finger length Ls as shown in FIG. 10A is the largest of all the saturation current values of the pMISFETs. The saturation current value Idsat of a pMISFET when finger lengths at both sides of the gate are the large finger length Lw as shown in FIG. 10C is the smallest. The saturation current value Idsat of a pMISFET when finger lengths at both sides of the gate are the middle finger length Lm as shown in FIG. 10B is almost the intermediate value between the above two values. Insofar as the data shown in FIG. 9 is concerned, the saturation current value Idsat of a pMISFET when a finger length at one side of the gate is the small finger length Ls and a finger length at the other side is the large finger length Lw as shown in FIG. 10D is the same as the saturation current value Idsat of the pMISFET shown in FIG. 10C.

Accordingly, it is preferable that pMISFETs are placed in the discontinuous active regions R10. In such a case, It is more preferable that the finger length is designed to be in the range greater than or equal to four times the gate length and less than or equal to 8.5 times the gate length. The discontinuous active regions R10 are preferably designed to have a width greater than or equal to 0.6 μm and less than or equal to 1.0 μm in the gate length direction.

With respect to nMISFETs, the saturation current value Idsat of an nMISFET when finger lengths at both sides of the gate are the middle finger length Lm as shown in FIG. 10B and the saturation current value Idsat of an nMISFET when finger lengths at both sides of the gate are the large finger length Lw as shown in FIG. 10C are almost the same and the largest of all the saturation current values. The saturation current value Idsat of an nMISFET when a finger length at one side of the gate is the small finger length Ls and a finger length at the other side is the large finger length Lw as shown in FIG. 10D is the second largest. The saturation current value Idsat of an nMISFET when finger lengths at both sides of the gate are the small finger length Ls are the smallest.

Accordingly, it is preferable that the nMISFETs are arranged in the continuous active regions R30. In such a case, it is more preferable that the finger length is designed to be in the range greater than or equal to four times the gate length.

Embodiment 1

Figure 1:
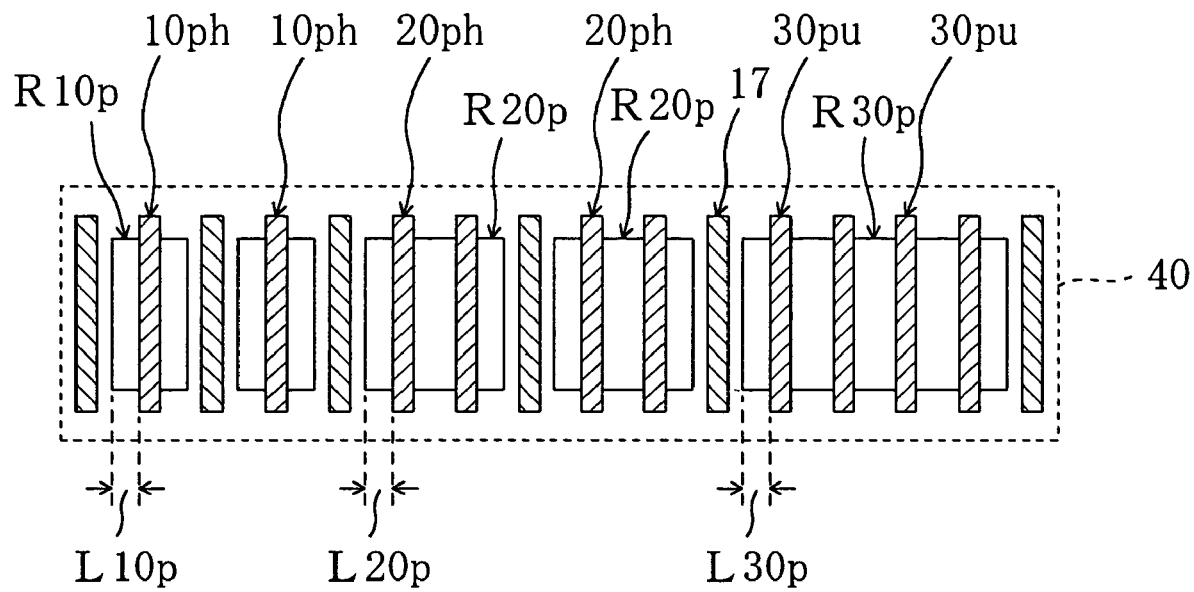
FIG. 1 is a plan view showing a layout of only pMISFETs in a semiconductor device according to a first embodiment of the present invention.

FIG. 1 is a plan view showing a layout of only pMISFETs in a semiconductor device according to a first embodiment of the present invention. A layout of nMISFETs according to this embodiment is not limited to a specific one. Therefore, the nMISFET are not shown and the description thereof is omitted.

As shown in FIG. 1, the active regions of the pMISFETs of this embodiment are arranged in an n-well 40. In the n-well 40, discontinuous active regions R10p in each of which only a high-driving-capability gate 10ph of a pMISFET is placed; two-input active regions R20p in each of which high-driving-capability gates 20ph of two respective pMISFETs are disposed; and continuous active regions R30p in which normal gates 30pu of three or more respective pMISFETs are continuously arranged, are provided. Dummy gates 17 are arranged on a trench isolation Ris of the semiconductor device so as to increase the accuracy in patterning for gates using a line-and-space pattern.

The pMISFETs of the semiconductor device of this embodiment are characterized by the following configuration.

High-driving-capability gates, which require high current driving capability, are arranged in the discontinuous active regions R10p and the two-input active regions R20p and are laid out such that a relatively large stress is applied from the trench isolation Ris to the high-driving-capability gates, as will be described later. Specifically, the gates of the pMISFETs which need high current driving capability are the high-driving-capability gates 10ph placed in the discontinuous active regions R10p (isolated gates) or the high-driving-capability gates 20ph disposed in the two-input active regions R20p (end gates). A finger length L10p with respect to each of the high-driving-capability gates 10ph in the discontinuous active regions R10p and a finger length L20p with respect to each of the high-driving-capability gates 20ph in the two-input active regions R20p are both the small finger length Ls shown in FIG. 10A.

On the other hand, the gates of pMISFETs which do not require high current driving capability are arranged in the continuous active regions R30p and laid out such that a stress is less applied from the trench isolation Ris to the gates. Specifically, the gates of the pMISFETs which do not need high current driving capability are the normal gates 30pu (end gates or intermediate gates) arranged in the continuous active regions R30p. A finger length L30p which is the shortest of the finger lengths with respect to one of the normal gates 30pu located at an end thereof in each of the continuous active regions R30p is the small finger length Ls shown in FIG. 10D.

(Effect of Embodiment 1)

An effect of a compressive stress applied from the trench isolation to a channel (hereinafter, referred to as a trench isolation stress) on transistor characteristics is that even transistors having the same gate length and the same gate width exhibit different performances. Hereinafter, a description will be given of effects of the trench isolation stress on transistor characteristics. The trench isolation stress causes a lattice distortion in the channel of a MISFET. Accordingly, in an nMISFET, the lattice distortion is likely to cause the effective mobility of carriers in its channel to decrease so that the performance of the nMISFET is degraded. On the contrary, in a pMISFET, the trench isolation stress applied in the gate length direction eliminates degeneration in the valence band, thereby creating heavy holes and light holes. These light holes have a small effective mass, so that the effective mobility in the pMISFET is likely to increase.

As a result, as shown in FIG. 9 and FIGS. 10A through 10D, when the trench isolation stress applied in the gate length direction is large, the current driving capability of the pMISFET improves.

As described above, in the semiconductor device of this embodiment, the high-driving-capability gates 10*ph* or 20*ph* are provided in the discontinuous active regions R10*p* or the two-input active regions R20*p*, so that pMISFETs with high driving capability can be obtained by utilizing light holes created due to lattice distortion.

In general, as a semiconductor device for use in a logic circuit, a so-called CMOS device provided with an nMISFET and a pMISFET is used. In this case, the carrier mobility in the pMISFET utilizing holes as carriers is much lower than in the nMISFET utilizing electrons as carriers. Accordingly, improvement in the performance of the pMISFET will contribute a large part in improving the performance of the whole CMOS device. In view of this, the present embodiment makes it possible to obtain a high performance CMOS device.

In this embodiment, high-driving-capability gates are also provided in the two-input active regions R20*p*. Alternatively, high-driving-capability gates may be provided only in the discontinuous active regions R10*p*. In such a case, as found from FIG. 9 and FIGS. 10A through 10D, the effects of the present invention can be more noticeably achieved.

Embodiment 2

Figure 2:
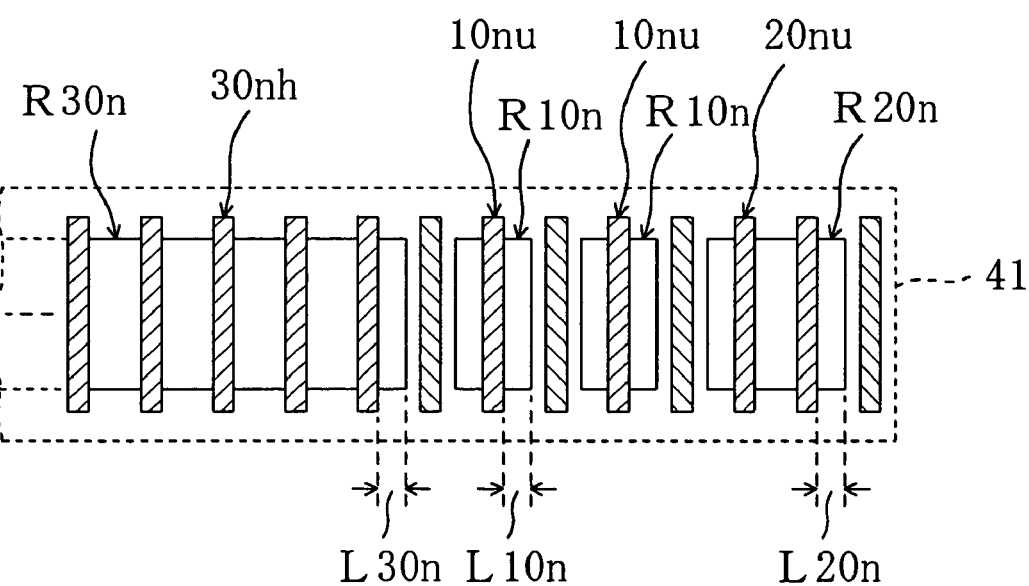
FIG. 2 is a plan view showing a layout of only nMISFETs in a semiconductor device according to a second embodiment of the present invention.

FIG. 2 is a plan view showing a layout of only nMISFETs in a semiconductor device according to a second embodiment of the present invention. A layout of pMISFETs according to this embodiment is not limited to a specific one. Therefore, the pMISFET are not shown and the description thereof is omitted.

As shown in FIG. 2, the nMISFET of this embodiment are arranged in a p-well 41. In the p-well 41, discontinuous active regions R10*n* in each of which only a normal gate 10*nu* of an nMISFET is placed; two-input active regions R20*n* in each of which normal gates 20*nu* of two respective nMISFETs are disposed; and continuous active regions R30*n* in each of which high-driving-capability gates 30*nh* of three or more respective nMISFETs are continuously arranged without being separated by a trench isolation Ris of the semiconductor device, are provided. Dummy gates 17 are arranged on the trench isolation Ris so as to increase the accuracy in patterning for gates using a line-and-space pattern.

The nMISFETs of the semiconductor device of this embodiment are characterized by the following configuration.

The gates of the nMISFETs which require high current driving capability are arranged in the continuous active regions R30*n* and configured such that a trench isolation stress is less applied to the gates. Specifically, the gates of the nMISFETs which need high current driving capability are the high-driving-capability gates 30*nh* arranged in the continuous active regions R30*n* (i.e., end gates or intermediate gates). A finger length L30*n*, which is the shortest of the finger lengths with respect to one of the high-driving-capability gates 30*nh* located at an end thereof in each of the continuous active regions R30*n*, is the small finger length Ls shown in FIG. 10D.

On the other hand, the gates of nMISFETs which do not need high current driving capability are arranged in the discontinuous active regions R10*n* and the two-input active regions R20*n* and laid out such that a relatively large stress is applied from the trench isolation Ris to the gates. Specifically, the gates of the nMISFETs which do not need high current driving capability are the normal gates 10*nu* (isolated gates) arranged in the discontinuous active regions R10*n* or the normal gates 20*nu* (end gates) disposed in the two-input active regions R20*n*. A finger length L10*n* with respect to each of the normal gates 10*nu* in the discontinuous active regions R10*n* and a finger length L20*n* with respect to each of the normal gates 20*nu* in the two-input active regions R20*n* are both the small finger length Ls shown in FIG. 10A.

In addition, nMISFETs whose drain parasitic capacitance needs to be reduced, or MISFETs in which a channel leakage current or a gate leakage current in the OFF state is not permitted are preferably arranged in the discontinuous active regions R10*n* or the two-input active regions R20*n*.

(Effect of Embodiment 2)

As described above, in an nMISFET, the effective mobility of carriers in its channel is likely to decrease so that the performance thereof is degraded.

Accordingly, as shown in FIG. 9 and FIGS. 10A through 10D, when the trench isolation stress in the gate length direction is large, the current driving capability of the nMISFET degrades.

As described above, in the semiconductor device of this embodiment, the high-driving-capability gates 30*nh* are arranged only in the continuous active regions R30*n*. Therefore, decrease in driving capability resulting from lattice distortion can be suppressed, thus obtaining an nMISFET with higher driving capability than that of the known semiconductor device. Accordingly, this embodiment makes it possible to obtain a high performance CMOS device including an nMISFET with high driving capability.

In addition, in the semiconductor device of this embodiment, the gates of rnMISFETs whose drain parasitic capacitance needs to be reduced, or the gates of nMISFETs in which a channel leakage current or a gate leakage current in the OFF state is not permitted may be arranged in the discontinuous active regions R10*n* or the two-input active regions R20*n*. In such a case, it is possible to obtain a semiconductor device including an nMISFET operating at high speed and having a small leakage current characteristic.

(Modified Example of Embodiment 2)

In this modified example of the second embodiment, the gates of pMISFETs are laid out as shown in FIG. 1 and the gates of nMISFETs are laid out as shown in FIG. 2. In this way, the effects of both of the first and second embodiments can be achieved.

Specifically, the high-driving-capability gates of pMISFETs which need high current driving capability are arranged in the discontinuous active regions R10*p* or the two-input active regions R20*p* under a large trench isolation stress, whereas the gates of nMISFETs which need high current driving capability are arranged in the continuous active regions R30*n*. Accordingly, the current driving capability increases in any of the pMISFETs and the nMISFETs. In addition, if nMISFETs whose drain parasitic capacitance needs to be reduced as necessary or nMISFETs in which a channel leakage current or a gate leakage current in the OFF state cannot be permitted are arranged in the discontinuous active regions R10*n* or the two-input active regions R20*n*, it is possible to obtain a semiconductor device including nMISFETs operating at high speed and having a small leakage current characteristic.

Embodiment 3

Figure 3:
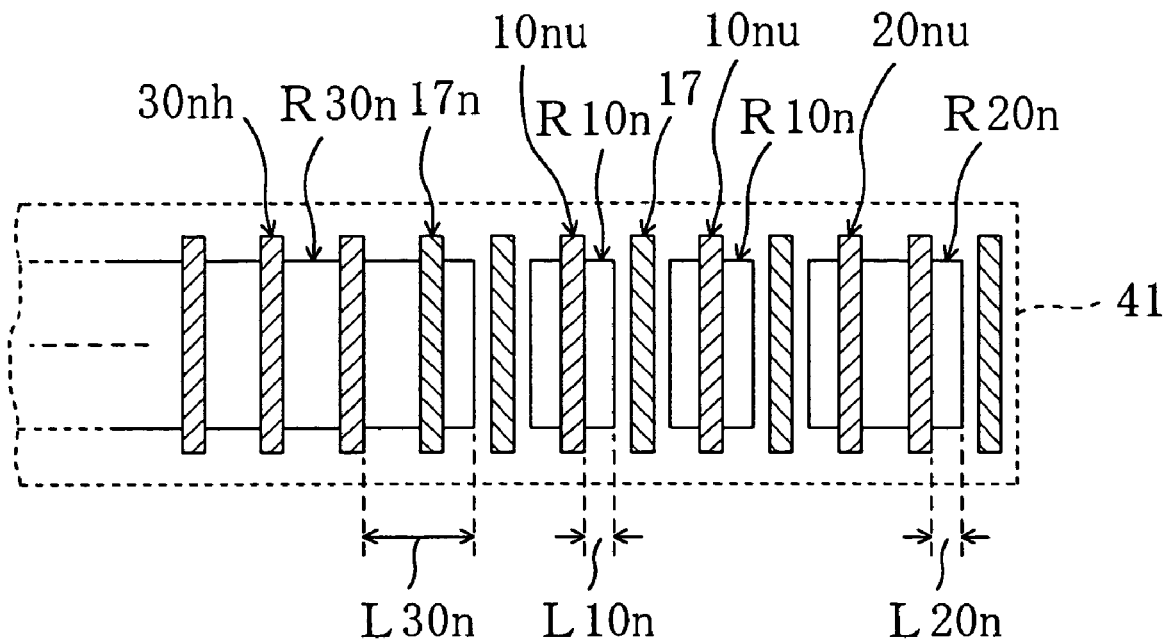
FIG. 3 is a plan view showing a layout of only nMISFETs in a semiconductor device according to a third embodiment of the present invention.

FIG. 3 is a plan view showing a layout of only nMISFETs in a semiconductor device according to a third embodiment of the present invention. A layout of pMISFETs according to this embodiment is not limited to a specific one. Therefore, the pMISFET are not shown and the description thereof is omitted.

As shown in FIG. 3, the nMISFET of this embodiment are arranged in a p-well 41. In the p-well 41, discontinuous active regions R10n in each of which only a normal gate 10nu of an nMISFET is placed; two-input active regions R20n in each of which normal gates 20nu of two respective nMISFETs are disposed; and continuous active regions R30n in each of which high-driving-capability gates 30nh of three or more respective nMISFETs are continuously arranged without being separated by a trench isolation Ris of the semiconductor device, are provided. Dummy gates 17 are arranged on the trench isolation Ris so as to increase the accuracy in patterning for gates using a line-and-space pattern.

The nMISFETs of the semiconductor device of this embodiment are characterized by the following configuration.

The high-driving-capability gates which require high current driving capability are arranged in the continuous active regions R30n and configured such that a trench isolation stress is less applied to the gates. In this aspect, this embodiment is the same as the second embodiment. However, in the third embodiment, one of the gates arranged in each of the continuous active regions R30n which is adjacent to the trench isolation Ris is a dummy gate 17n. That is to say, the gates of the nMISFETs which need high current driving capability are the high-driving-capability gates 30nh (intermediate gates) arranged in the continuous active regions R30n except for the dummy gate 17n. A finger length L30n which is the shortest of the finger lengths with respect to one of the high-driving-capability gates 30nh adjacent to the dummy gate 17n in each of the continuous active regions R30n is the middle finger length Lm shown in FIG. 10B.

On the other hand, the gates of nMISFETs which do not require high current driving capability are arranged in the discontinuous active regions R10n and the two-input active regions R20n and laid out such that a relatively large stress is applied from the trench isolation Ris to the gates. Specifically, the gates of the nMISFETs which do not need high current driving capability are the normal gates 10nu (isolated gates) placed in the discontinuous active regions R10n or the normal gates 20nu (end gates) disposed in the two-input active regions R20n. A finger length L10n with respect to each of the normal gates 10nu in the discontinuous active regions R10n and a finger length L20n with respect to each of the normal gates 20nu in the two-input active regions R20n are both the small finger length Ls shown in FIG. 10A. In this aspect, this embodiment is the same as the second embodiment.

In this embodiment, the high-driving-capability gates 30nh of nMISFETs which need high current driving capability are arranged in the continuous active regions R30n and the dummy gate 17n is provided at an end of each of the continuous active regions R30n. Accordingly, a finger length L30n which is the shortest of the finger lengths with respect to one of the high-driving-capability gates 30nh of the nMISFETs adjacent to the dummy gate 17n is the middle finger length Lm. As shown in FIG. 9, with respect to nMISFETs, the saturation current value Idsat of an nMISFET when finger lengths at the sides of the gate are the middle finger length Lm is much higher than the saturation current value Idsat of an nMISFET when one of the finger lengths at the sides of the gate is the small finger length Ls.

Accordingly, in the semiconductor device of this embodiment, decrease in current driving capability resulting from a trench isolation stress can be suppressed in all the nMISFETs whose gates are arranged in the continuous active regions R30n, thus obtaining a semiconductor device including nMISFETs having higher current driving capability than in the second embodiment.

Embodiment 4

Figure 4:
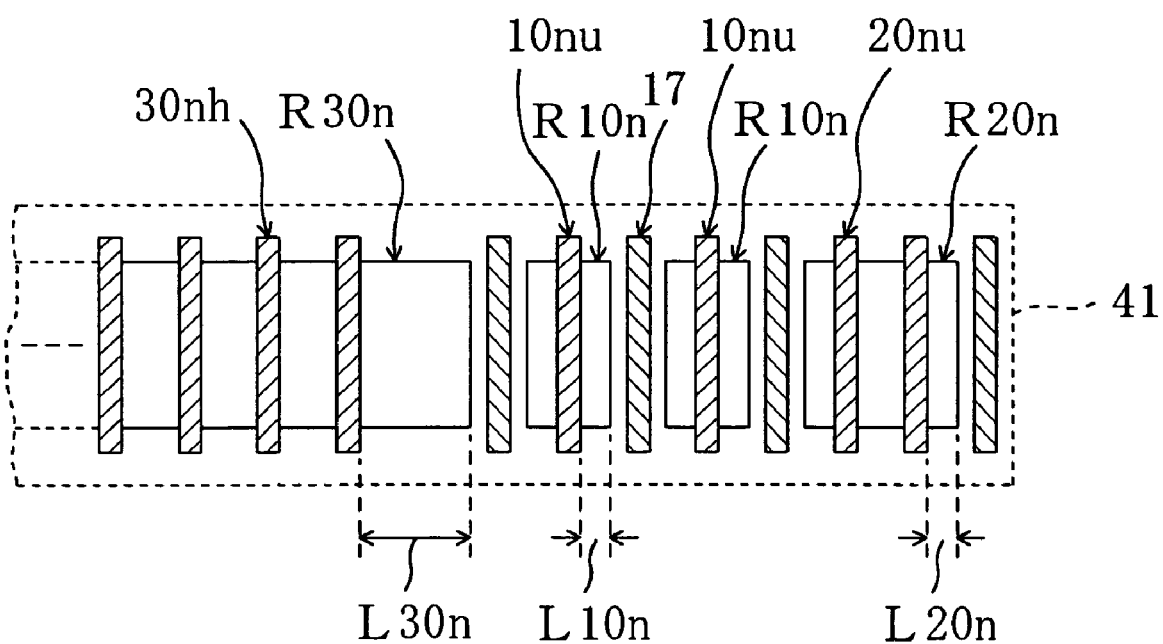
FIG. 4 is a plan view showing a layout of only nMISFETs in a semiconductor device according to a fourth embodiment of the present invention.

FIG. 4 is a plan view showing a layout of only nMISFETs in a semiconductor device according to a fourth embodiment of the present invention. A layout of pMISFETs according to this embodiment is not limited to a specific one. Therefore, the pMISFET are not shown and the description thereof is omitted.

As shown in FIG. 4, the nMISFET of this embodiment are arranged in a p-well 41. In the p-well 41, discontinuous active regions R10n in each of which only a normal gate 10nu of an nMISFET is placed; two-input active regions R20n in each of which normal gates 20nu of two respective nMISFETs are disposed; and continuous active regions R30n in each of which high-driving-capability gates 30nh of three or more respective nMISFETs are continuously arranged without being separated by a trench isolation Ris of the semiconductor device, are provided. Dummy gates 17 are arranged on the trench isolation Ris so as to increase the accuracy in patterning for gates using a line-and-space pattern.

The nMISFETs of the semiconductor device of this embodiment are characterized by the following configuration.

The high-driving-capability gates 30nh which require high current driving capability are arranged in the continuous active regions R30n and configured such that a trench isolation stress is less applied to the gates. In this aspect, this embodiment is the same as the second embodiment. However, in the fourth embodiment, a finger length L30n which is the shortest of the finger lengths with respect to one of the high-driving-capability gates 30nh adjacent to the trench isolation Ris in each of the continuous active regions R30n is the middle finger length Lm shown in FIG. 10B.

On the other hand, the gates of nMISFETs which do not require high current driving capability are arranged in the discontinuous active regions R10n and the two-input active regions R20n and laid out such that a relatively large stress is applied from the trench isolation Ris to the gates. Specifically, the gates of the nMISFETs which do not need high current driving capability are the normal gates 10nu (isolated gates) placed in the discontinuous active regions R10n or the normal gates 20nu (end gates) disposed in the two-input active regions R20n. A finger length L10n with respect to each of the normal gates 10nu in the discontinuous active regions R10n and a finger length L20n with respect to each of the normal gates 20nu in the two-input active regions R20n are both the small finger length Ls shown in FIG. 10A. In this aspect, this embodiment is the same as the second embodiment.

In this embodiment, the high-driving-capability gates 30nh of nMISFETs which require high current driving capability are arranged in the continuous active regions R30n and the finger length L30n which is the shortest of the finger lengths with respect to one of the high-driving-capability gates 30nh located at an end thereof is the middle finger length Lm. Accordingly, as in the third embodiment, decrease in current driving capability resulting from a trench isolation stress can be suppressed in all the nMISFETs arranged in the continuous active regions R30n, thus obtaining a semiconductor device including nMISFETs having higher current driving capability than in the second embodiment.

That is to say, the finger length L30n with respect to one of the gates of the nMISFETs arranged in the continuous active regions R30n which is located at an end thereof is designed to be in the range greater than or equal to four times the gate length, thereby achieving the same effects as those in the third embodiment, without providing any dummy gate.

Embodiment 5

Figure 5:
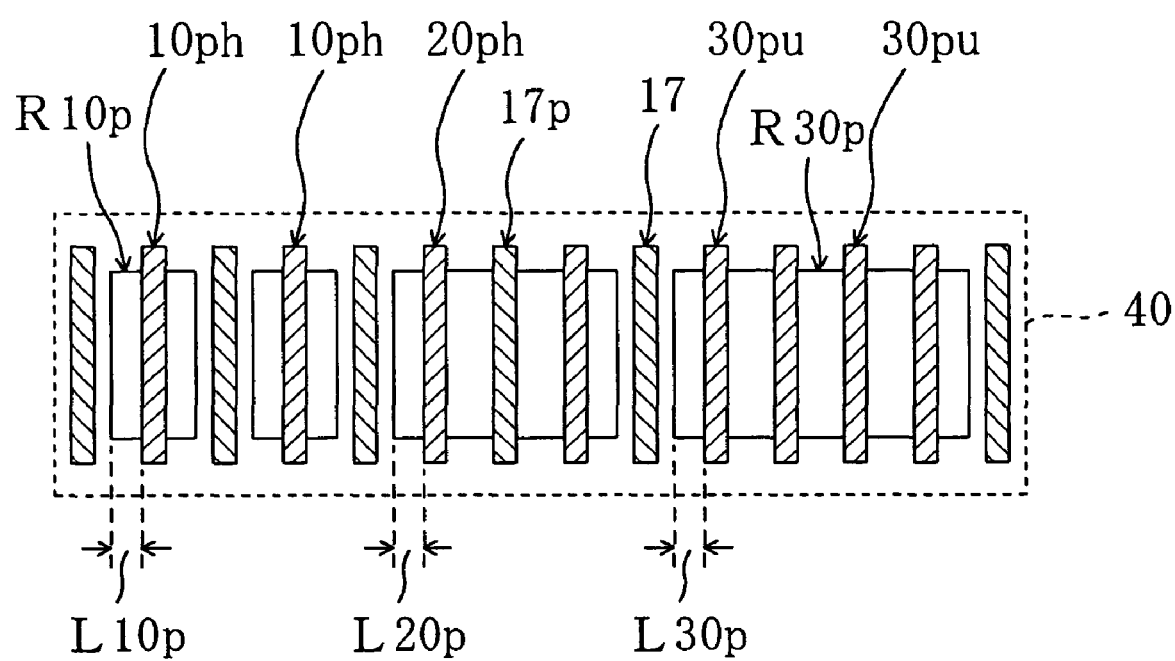
FIG. 5 is a plan view showing a layout of only pMISFETs in a semiconductor device according to a fifth embodiment of the present invention.

FIG. 5 is a plan view showing a layout of only pMISFETs in a semiconductor device according to a fifth embodiment of the present invention. A layout of nMISFETs according to this embodiment is not limited to a specific one. Therefore, the rMISFET are not shown and the description thereof is omitted.

As shown in FIG. 5, the respective active regions of the pMISFET of this embodiment are arranged in an n-well 40. In the n-well 40, discontinuous active regions R10p in each of which only a high-driving-capability gate 10ph of a pMISFET is placed; two-input active regions R20p in each of which high-driving-capability gates 20ph of two respective pMISFETs are disposed; and continuous active regions R30p in each of which normal gates 30pu of three or more respective pMISFETs are continuously arranged, are provided. Dummy gates 17 are arranged on a trench isolation Ris of the semiconductor device so as to increase the accuracy in patterning for gates using a line-and-space pattern.

The pMISFETs of the semiconductor device of this embodiment are characterized by the following configuration.

The high-driving-capability gates which require high current driving capability are arranged in the discontinuous active regions R10p and the two-input active regions R20p and laid out such that a relatively large stress is applied from the trench isolation Ris to the gates. Specifically, the gates of the pMISFETs which need high current driving capability are the high-driving-capability gates 10ph (isolated gates) placed in the discontinuous active regions R10n or the high-driving-capability gates 20ph (end gates) disposed in the two-input active regions R20p. A finger length L10p with respect to each of the high-driving-capability gates 10ph in the discontinuous active regions R10p and a finger length L20p with respect to each of the high-driving-capability gates 20ph in the two-input active regions R20p are both the small finger length Ls shown in FIG. 10A. In this aspect, this embodiment is the same as the first embodiment.

However, in this embodiment, a dummy gate 17p for separation is provided between the two high-driving-capability gates 20ph in each of the two-input active regions R20p. This is a feature of the semiconductor device of this embodiment.

On the other hand, as in the first embodiment, the gates of pMISFETs which do not require high current driving capability are arranged in the continuous active regions R30p and laid out such that a stress is less applied from the trench isolation Ris to the gates. Specifically, the gates of pMISFET which do not need high current driving capability are the normal gate 30pu (end gates or intermediate gates) arranged in the continuous active regions R30p. In addition, a finger length L30p which is the shortest of the gate lengths with respect to one of the normal gates 30pu located at an end thereof in each of the continuous active regions R30p is the small finger length Ls as shown in FIG. 10D.

Accordingly, in the semiconductor device of this embodiment, the same effects as those in the first embodiment are achieved. In addition, it is possible to prevent interference between signals for two pMISFETs provided in a two-input active region.

What is claimed is:

1. A semiconductor device comprising:
   a first discontinuous active region in which only a gate of a pMISFET is placed;
   a first continuous active region in which gates of three or more respective pMISFETs are arranged; and
   a trench isolation surrounding the first discontinuous active region and the first continuous active region,
   wherein gates of pMISFETs of a first type are arranged in the first continuous active region, whereas a gate of a pMISFET of a second type, which needs higher current driving capability than the pMISFETs of the first type, is placed in the first discontinuous active region, and
   a stress applied from the trench isolation to a channel of the pMISFET of the second type is larger than a stress applied to a channel of the pMISFET of the first type.

2. The semiconductor device of claim 1, including a two-input active region which is surrounded by the trench isolation and in which gates of two respective pMISFETs are disposed,
   wherein gates of two respective pMISFETs of a third type, which need higher current driving capability than the pMISFETs of the first type, are disposed in the two-input active region.

3. The semiconductor device of claim 2, wherein a dummy gate for separation is provided between the gates of the two pMISFETs of the third type.

4. The semiconductor device of claim 1, wherein the first discontinuous active region is designed to have a width in the range greater than or equal to five times the gate length and less than or equal to 8.5 times the gate length, in the gate length direction.

5. The semiconductor device of claim 1, wherein the first discontinuous active region is designed to have a width in the range greater than or equal to 0.6 µm and less than or equal to 1.0 µm in the gate length direction.

6. The semiconductor device of claim 1, including:
   a second discontinuous active region which is surrounded by the trench isolation and in which only a gate of an nMISFET is placed; and
   a second continuous active region which is surrounded by the trench isolation and in which gates of three or more respective nMISFETs are arranged,
   wherein the gate of an nMISFET of the first type is arranged in the second discontinuous active region, whereas gates of nMISFETs of the second type, which need higher current driving capability than the nMISFET of the first type, are placed in the second continuous active region.

7. The semiconductor device of claim 1, wherein the pMISFET of the second type has the same gate width as the pMISFET of the first type.

8. A semiconductor device comprising:
   a discontinuous active region in which only a gate of an nMISFET is placed;
   a continuous active region in which gates of three or more respective nMISFETs are arranged; and
   a trench isolation surrounding the discontinuous active region and the continuous active region, wherein the gate of an nMISFET of a first type is arranged in the discontinuous active region, whereas gates of nMISFETs of a second type, which need higher current driving capability than the nMISFET of the first type, are placed in the continuous active region.

9. The semiconductor device of claim 8, including a two-input active region which is surrounded by the trench isolation and in which gates of two respective nMISFETs are disposed, wherein gates of nMISFETs of a third type, which need higher current driving capability than the nMISFETs of the second type, are disposed in the two-input active region.

10. The semiconductor device of claim 8, including a dummy gate provided between the trench isolation and one of the gates of the nMISFETs of the second type located at an end thereof in the continuous active region.

11. The semiconductor device of claim 8, wherein a distance between the trench isolation and one of the gates of the nMISFETs of the second type located at an end thereof in the continuous active region is greater than or equal to four times the gate length.

12. The semiconductor device of claim 9, wherein a gate of an nMISFET of a fourth type in which a drain parasitic capacitance, a channel leakage current or a gate leakage current needs to be reduced more than in the nMISFETs of the first type is placed in the discontinuous active region or the two-input active region.

13. The semiconductor device of claim 8, wherein a channel of the nMISFET of the first type is under a stress which is larger than a stress to a channel of the nMISFET of the second type and is applied from the trench isolation.

14. The semiconductor device of claim 8, wherein the nMISFET of the second type has the same gate width as the nMISFET of the first type.

* * * * *